(12) United States Patent
Lin et al.

(10) Patent No.: US 7,130,191 B2
(45) Date of Patent: Oct. 31, 2006

(54) FUNCTION MODULE WITH BUILT-IN HEAT DISSIPATION DEVICE

(75) Inventors: Wen-Yen Lin, Taoyuan (TW);
Tsan-Nan Chien, Taipei (TW);
Chun-Wen Pai, Jhonghe (TW)

(73) Assignee: Quanta Computer Inc., Taoyuan (TW)

( * ) Notice: Subject to any disclaimer, the term of this patent is extended or adjusted under 35 U.S.C. 154(b) by 192 days.

(21) Appl. No.: 10/863,458

(22) Filed: Jun. 8, 2004

(65) Prior Publication Data

US 2004/0246678 A1    Dec. 9, 2004

(30) Foreign Application Priority Data

Jun. 9, 2003    (TW) .............................. 92115517 A

(51) Int. Cl.
*H05K 7/20* (2006.01)
(52) U.S. Cl. .................. 361/695; 165/80.3; 165/121; 361/697; 361/715
(58) Field of Classification Search ................ 361/690, 361/694–695, 697, 702, 704, 707, 710, 699, 361/715, 719–721
See application file for complete search history.

(56) References Cited

U.S. PATENT DOCUMENTS

| | | | | |
|---|---|---|---|---|
| 4,884,168 A | * | 11/1989 | August et al. | 361/702 |
| 5,768,104 A | * | 6/1998 | Salmonson et al. | 361/704 |
| 6,154,367 A | * | 11/2000 | Pavlovic | 361/707 |
| 6,219,236 B1 | * | 4/2001 | Hirano et al. | 361/695 |
| 6,466,441 B1 | * | 10/2002 | Suzuki | 361/695 |

* cited by examiner

*Primary Examiner*—Gregory Thompson
(74) *Attorney, Agent, or Firm*—Thomas, Kayden, Horstemeyer & Risley

(57) ABSTRACT

A function module with built-in heat dissipation device. The function module includes a first circuit board, a second circuit board, a first height-compensation heat spreader, a second height-compensation heat spreader, and a heat dissipation fin. The first circuit board has a first surface, a first and second device. The second circuit board has a second surface facing the first surface, a third device, and a fourth device. The first height-compensation heat spreader has a first face, contacting the first and second devices simultaneously, and a third face, opposite to the first face. The second height-compensation heat spreader has a second face, contacting the third and fourth devices simultaneously, and a fourth face, opposite to the second face. The heat dissipation fin is disposed between the first circuit board and the second circuit board.

30 Claims, 6 Drawing Sheets

FUNCTION MODULE WITH BUILT-IN HEAT DISSIPATION DEVICE

BACKGROUND OF THE INVENTION

1. Field of the Invention

The present invention relates to a function module, and in particular to a function module with built-in heat dissipation device.

2. Description of the Related Art

As semiconductor process technology has developed, the operating speeds thereof increased accordingly, such that a single electronic device may incorporate multiple functions. However, due to such designs, it is difficult to simultaneously control heat dissipation, signal quality, and electromagnetic radiation in the electronic device.

Generally, electronic devices communicate via a printed circuit board (PCB). In a computer system, electronic devices, such as a central processor unit (CPU), a chipset, a graphics processing unit (GPU), an accelerated graphics port (AGP), or dynamic random access memory (DRAM), are disposed on different areas of a motherboard. To solve heat dissipation problems for each electronic device, a conventional solution is provided for each electronic device.

For example, a combination of a heat dissipation fin, a heat pipe, and a fan is usually used for the CPU. The heat dissipation fin and/or the fan are usually used for the chipset or the GPU. As shown in FIG. 1, a conventional heat dissipation device 20 of a notebook computer including a heat conduction layer 21, a heat pipe 22, a heat dissipation fin 23, and a fan 24 is used to dissipate heat for a device 10 such as a CPU. The heat dissipation device 20 operates as follows: first, the heat conduction layer 21 is abutted against the device 10 to conduct heat from the device 10 to a larger area such that heat density is reduced; next, the heat pipe 22 guides heat from the heat conduction layer 21 to the heat dissipation fin 23 at a further end; finally, airflow is produced by the fan 24, following the direction of arrows A and B through the heat dissipation fin 23, and thus, heat is carried away from the heat dissipation fin 23 by the airflow.

The heat dissipation device 20 is challenged by thermal resistance from heat conduction and heat convection. The thermal resistance of heat conduction includes contact resistance between the device 10 and the heat conduction layer 21, diffusion resistance of the heat conduction layer 21, contact resistance between the heat conduction layer 21 and the heat pipe 22, thermal resistance of the heat pipe 22, contact resistance between the heat pipe 22 and the heat dissipation fin 23, and diffusion resistance of the heat dissipation fin 23. Additionally, the airflow produced by the fan 24, attempting to carry heat away from the heat dissipation fin 23, generates the thermal resistance of heat convection.

As mentioned above, the conventional heat dissipation device 20 is challenged by thermal resistance of heat conduction and convection. To effectively solve the heat dissipation problem of a motherboard with a plurality of electronic devices thereon, a heat dissipation device with better efficiency is required to increase heat conduction and dissipation and minimize thermal resistance thereof.

SUMMARY OF THE INVENTION

Accordingly, an object of the invention is to provide a function module with built-in heat dissipation device that can effectively reduce thermal resistance, increase heat dissipation, maximize space utility rate therein, and minimize costs.

To reduce thermal resistance, the heat dissipation path must be shortened. For example, the conventional heat dissipation device 20 has a heat conduction layer 21, a heat pipe 22, and a heat dissipation fin 23. The thermal resistance of the heat dissipation device 20 includes contact resistance between the device 10 and the heat conduction layer 21, diffusion resistance of the heat conduction layer 21, contact resistance between the heat conduction layer 21 and the heat pipe 22, thermal resistance of the heat pipe 22, contact resistance between the heat pipe 22 and the heat dissipation fin 23, and diffusion resistance of the heat dissipation fin 23. In the present invention, eliminating the heat pipe 22 effectively shortens the heat dissipation path, and thus, the thermal resistance is greatly reduced.

The present invention utilizes a height-compensation heat spreader. The module includes devices with different heights thereon and heat is conducted by the height-compensation heat spreader (hereinafter called the "heat spreader"). The contact face between the heat spreader and the devices is a stepped face. That is, the contact face changes its elevation so that the varied height of the contact face compensates for the different device height. The opposite side of the contact face is flat and a heat dissipation fin is disposed thereon. Thus, a heat pipe is not required to conduct heat from a heat dissipation fin located at a far end. By eliminating the heat pipe, the present invention not only reduces the corresponding thermal resistance, but also effectively reduces the manufacturing cost.

In view of this, a function module with a built-in heat dissipation device is provided. The function module includes a first circuit board, a second circuit board, a first heat spreader, a second heat spreader, and a heat dissipation fin. The first circuit board has a first surface, a first device, and a second device. The first and second devices having different heights are disposed on the first surface. The second circuit board has a second surface facing the first surface, a third device, and a fourth device. The third and the fourth devices having different heights are disposed on the second surface. The first heat spreader has a first face and a third face, opposite to the first face. The first face is a stepped face, contacting the first and second devices simultaneously, and the third face is a flat face. The second heat spreader has a second face and a fourth face, opposite to the second face. The second face is a stepped face, contacting the third and fourth devices simultaneously, and the fourth face is a flat face. The heat dissipation fin is disposed between the first circuit board and the second circuit board in a manner such that the heat dissipation fin is abutted by the third face of the first heat spreader and the fourth face of the second heat spreader layer respectively.

In a preferred embodiment, the first circuit board further includes a third surface, opposite to the first surface, and the third surface is a ground surface.

Accordingly, the second circuit board further includes a fourth surface, opposite to the second surface, and the fourth surface is a ground surface. The ground surface comprises copper.

In another preferred embodiment, the first circuit board further includes a first power supply and a third surface, opposite to the first surface, and the power supply is disposed on the third surface.

The second circuit board further includes a second power supply and a fourth surface, opposite to the second surface, and the power supply is disposed on the fourth surface.

In another preferred embodiment, the second circuit board is coupled to the first circuit board by a flat cable or a connector.

Moreover, the heat spreaders and the heat dissipation fin are formed as one heat dissipation device to further reduce installation costs and the thermal resistance therebetween.

The first and second heat spreaders are also composed of copper, aluminum, metal, metallic composites or non-metallic composites with thermal conductivity greater than or equal to 100 W/m·K.

Furthermore, a brazing solder, tin solder, thermal interface material, or grease is disposed between the first and second heat spreaders and the heat dissipation fin.

The function module further comprises a fan, connected to the heat dissipation fin, for further dissipation of heat therefrom.

The first circuit board further comprises a third surface, opposite to the first surface, and a fifth device, disposed thereon.

The second circuit board further includes a fourth surface, opposite to the second surface, and a sixth device, disposed thereon. Thus, the function module with a plurality of circuit boards shares a set comprising a heat dissipation fin and a fan to maximize space utility rate and minimize cost.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

As the operating speed of electronic devices increases, the transmission speed of the front side bus (FSB) of the computer has gradually increased from 333 MHz to 800 MHz. Thus, a single chip may incorporate multiple functions. Specifically, an electronic device, such as a CPU, a North Bridge, or a GPU, located on the front side bus is provided with multiple functions.

Accordingly, it is difficult to simultaneously control heat dissipation, signal quality, and electromagnetic radiation in the electronic device. Thus, it is difficult to design the front side bus on the motherboard. In addition, the pin counts of the electron device increases accordingly. Thus, a high density interconnect (HDI) is provided as the circuit board of the computer system.

A function module, as disclosed in this invention, is provided with the high-speed and high-density devices, solving heat dissipation problems thereof. In the invention, electronic devices with high speed transmission such as CPU, North Bridge, GPU or AGP, DRAM or GRAM are disposed on an HDI. Via the HDI, the high speed devices communicate with each other to constitute an independent function module. The function module can be coupled to a printed circuit board with other devices via a connector, a flat cable, or solder, to constitute a complete motherboard of the computer. Thus, problems created by high speed devices are solved, and costs thereof are effectively reduced.

Specifically, the function module is divided into two circuit boards. For a function module with more devices or with devices having different functions, the devices can be disposed on both surfaces of the function module according to function. Moreover, the devices can be disposed on the surfaces of the function module by surface mount technology (SMT).

However, when all the high speed devices are disposed on the function module, heat originally generated on the motherboard, is also concentrated on the function module. Furthermore, since the high speed devices are disposed in a relatively small area, it is difficult to provide heat-dissipation for each device.

Figure 1:
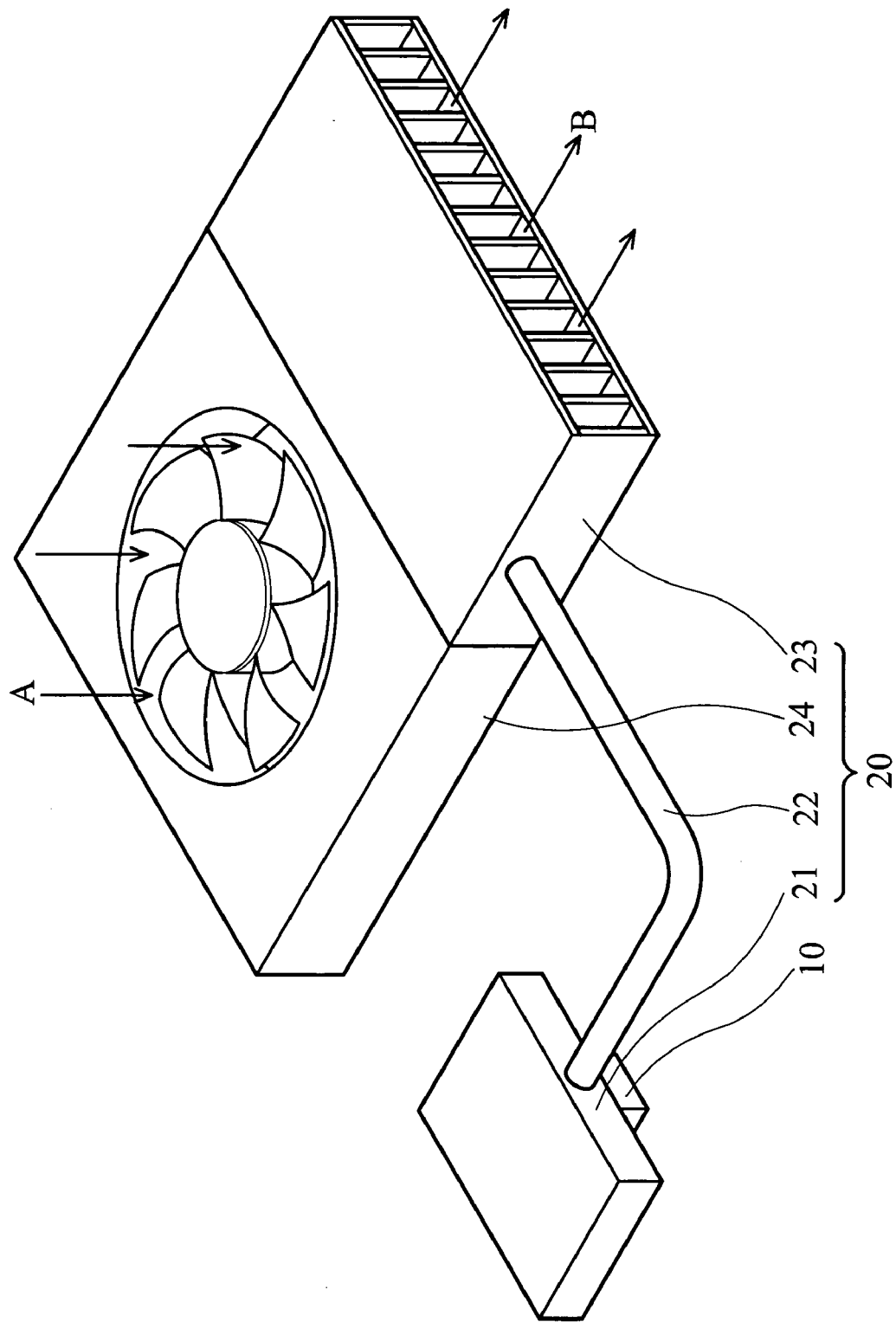
FIG. 1 is a schematic view of a conventional heat dissipation device.

In comparison with the conventional function module as shown in FIG. 1, the present invention eliminates the heat pipe to reduce thermal resistance thereof, thus, increasing heat dissipation and minimizing material and manufacturing costs. In addition, the space for other devices in notebook computers is maximized. The detailed descriptions of the present invention are provided as follows.

FIRST EMBODIMENT

Figure 2:
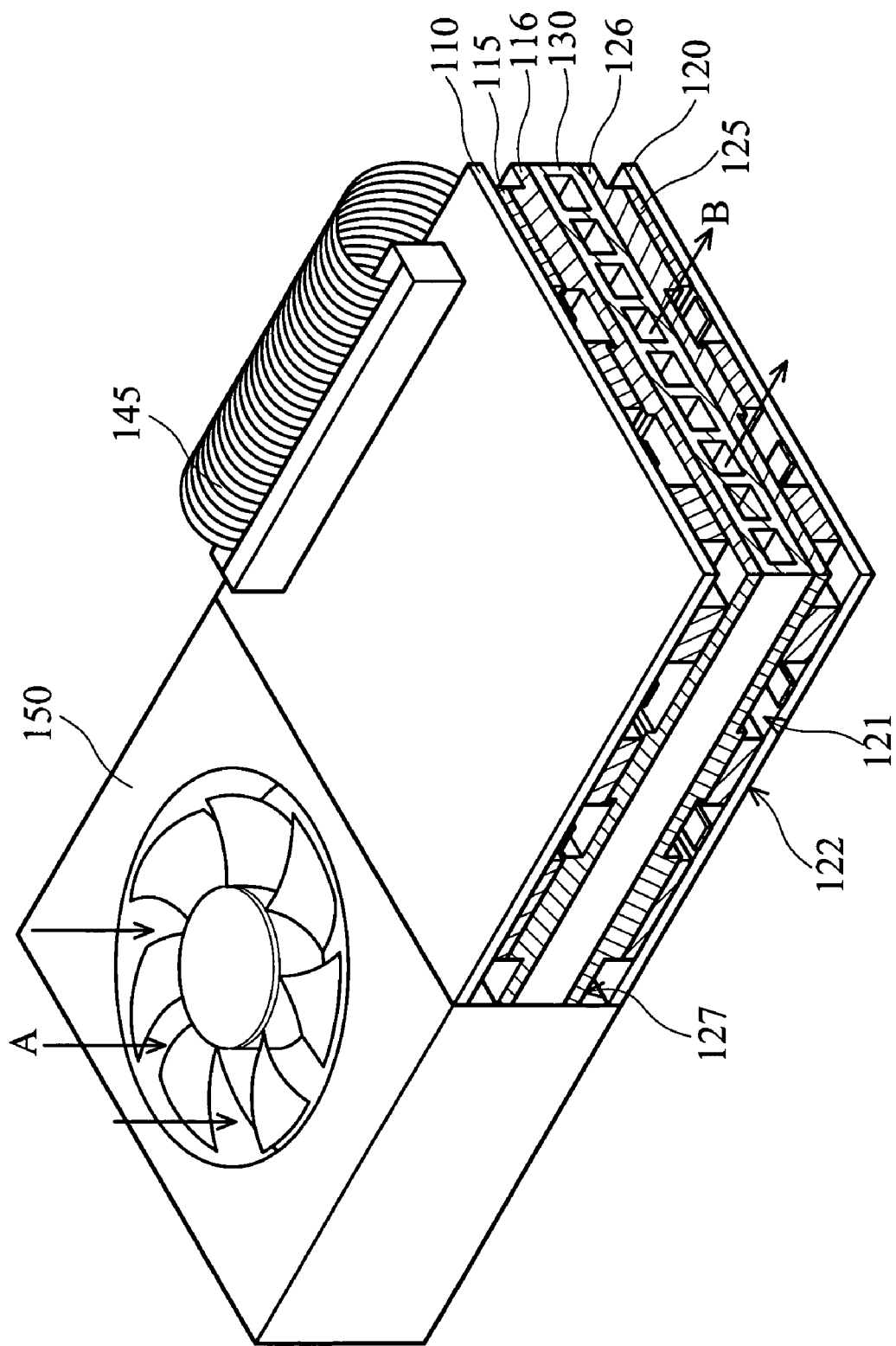
FIG. 2 is a schematic view of a function module with built-in heat dissipation device according to the first embodiment of the present invention.
Figure 3:
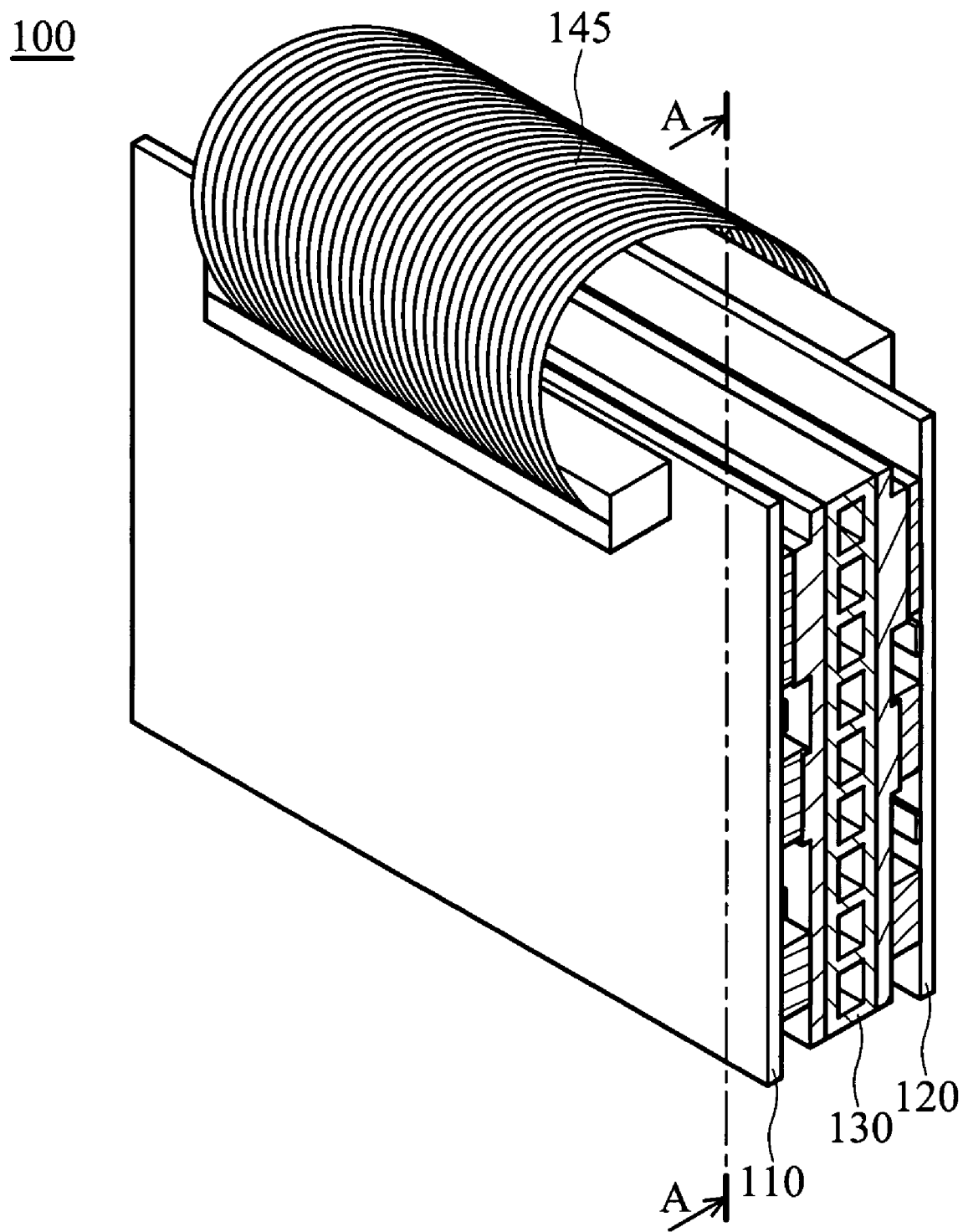
FIG. 3 is a schematic side view of the function module with built-in heat dissipation device according to the first embodiment of the present invention.
Figure 4:
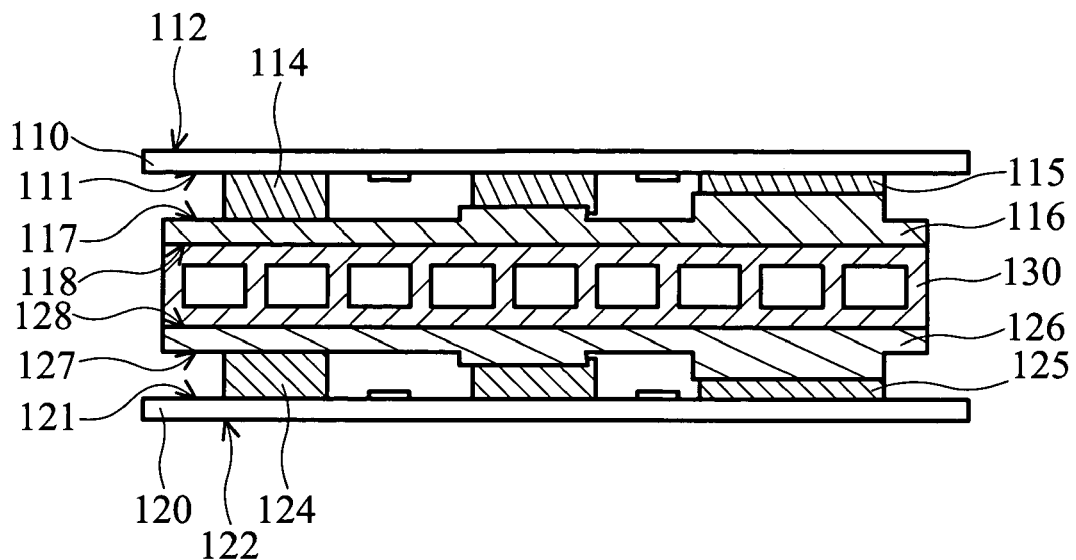
FIG. 4 is a cross section of the function module along line A—A of FIG. 3.

To effectively dissipate heat, the function module can be modified to more effectively utilize the heat dissipation device. FIGS. 2–4 show a function module 100, with a built-in heat dissipation device, as disclosed in this invention.

FIG. 2 shows the double-sided function module 100 with a plurality of devices thereon, and the function module 100 is divided into two circuit boards with devices on each surface of the first circuit board 110 and the second circuit board 120. Both the first circuit board 110 and the second circuit board 120 may comprise an HDI. The circuit boards may be coupled via the flat cable 145 or disposed on a motherboard. Otherwise, the first circuit board 110 may be coupled to the second circuit board 120 without the flat cable. The function module 100 further includes first and second height-compensation heat spreaders 116, 126 and a heat dissipation fin 130. Both height-compensation heat spreaders 116, 126 are disposed on the devices 115, and 125 to quickly and uniformly conduct heat to the heat dissipation fin 130. The function module 100 also includes a fan 150 connected adjacent to the heat dissipation fin 130. The airflow produced by the fan 150 flows from the fan 150 to the heat dissipation fin 130 along arrows A and B to take out the heat therefrom.

As shown in FIGS. 3 and 4, the function module 100 is composed of the following elements. The first circuit board 100 has a first surface 111 with a first device 114 and a second device 115 disposed thereon. It is understood that the function module 100 is not limited to two devices on each surface, there may be more than two devices provided thereon. The second circuit board 120 has a second surface 121 with a third device 124, and a fourth device 125 disposed thereon. All the above devices may have different heights. For the heat dissipation devices, the first height-compensation heat spreader 116 has a first face 117 and a third face 118, opposite to the first face 117. The first face 117 is a stepped face so that the first face 117 simultaneously contacts all the devices disposed on the first surface 111 of the first circuit board 110, and the third face 118 is a flat face, directly mounted on the heat dissipation fin 130. Thus, the present invention does not require a heat pipe to connect the device and the heat dissipation fin, as shown in FIG. 1. The second height-compensation heat spreader 126 also has a second face 127 and a fourth face 128, opposite to the second face 127. The second face 127 is a stepped face, simultaneously contacting all the devices disposed on the second surface 121 of the second circuit board 120, and the fourth face 128 is a flat face, directly mounted on the heat dissipation fin 130. Thus, the heat dissipation fin 130 is disposed between the first circuit board 110 and the second circuit board 120 in a manner such that the heat dissipation fin 130 is abutted by the first height-compensation heat spreader 116 and the second height-compensation heat spreader 126 respectively. Also, the first and second heat spreaders 116, 126 are made of copper, aluminum, metal, metallic composites or non-metallic composites with thermal conductivity greater than or equal to 100 W/m·K.

Furthermore, a brazing solder, tin solder, thermal interface material, or grease is disposed between the first and second height-compensation heat spreaders 116, 126 and the heat dissipation fin 130.

Figure 5:
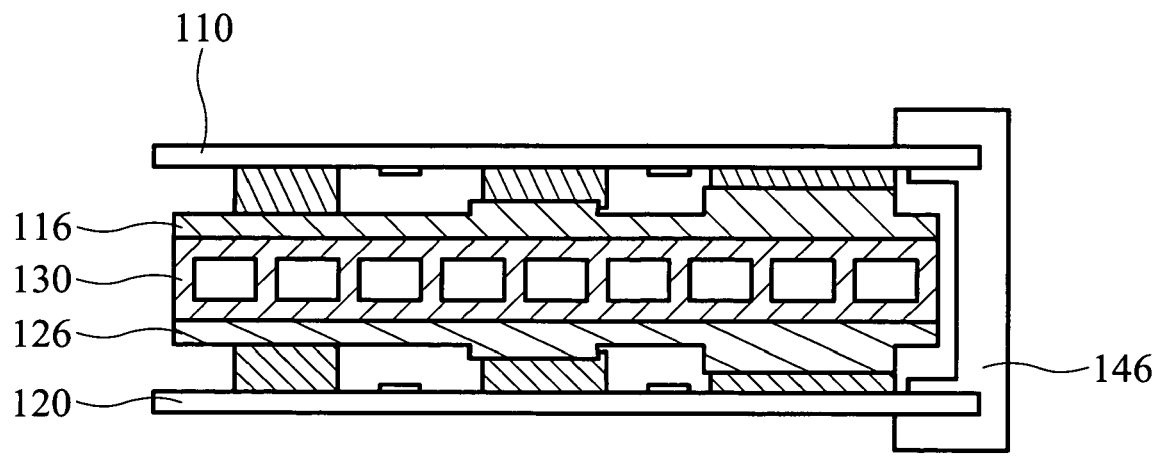
FIG. 5 is a side view of the first varied embodiment of the function module with built-in heat dissipation device as disclosed in the first embodiment.

FIG. 5 is a side view of the first varied embodiment of the function module 100 in the first embodiment. The function module 100 also includes a connector 146, such as a slot connector. The connector 146 connects the first circuit board 110 and the second circuit board 120, providing communicability therebetween.

To promote quality of the high frequency signal and supply electricity, a ground layer is disposed in the function module. As shown in FIG. 4, the first circuit board 110 further has a third surface 112, opposite to the first surface 111. The second circuit board 120 has a fourth surface 122, opposite to the second surface 121. The third and fourth surfaces 112, 122 are ground surfaces. The ground surfaces are made of copper with a thickness of 1.5 mil or greater. Furthermore, the above-mentioned surfaces 112, and 122 can be disposed with a power supply. In this case, the second circuit board 120 further has a power supply disposed on the fourth surface 122. Accordingly, the ground or the power supply effectively increases the heat dissipation area, providing adequate heat dissipation for the function module.

Figure 6:
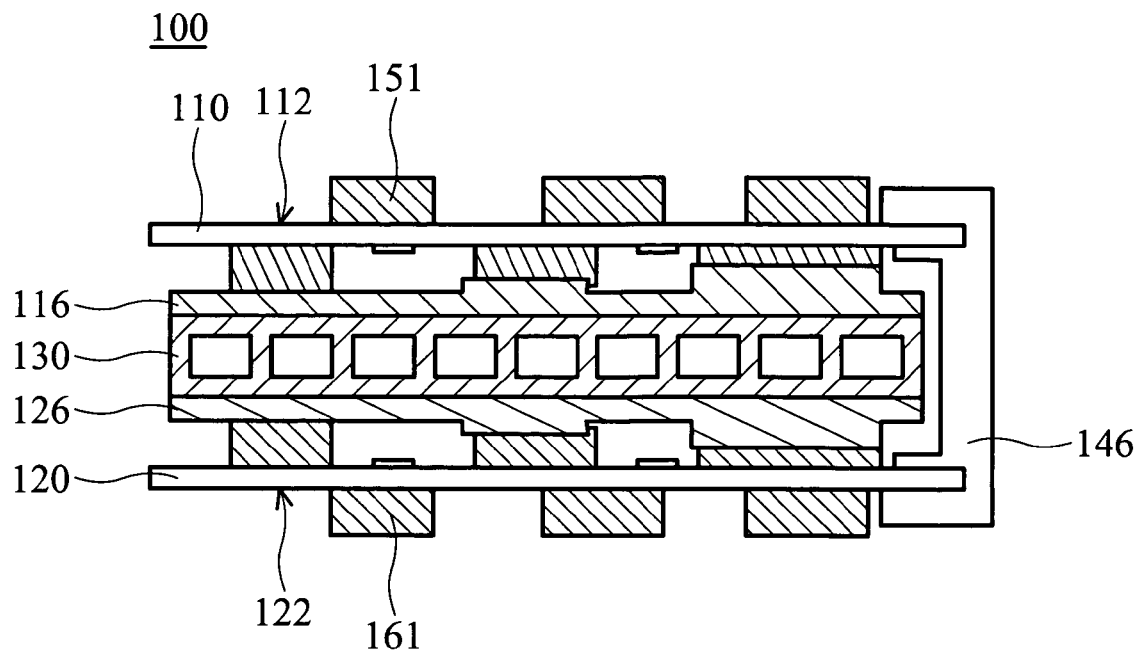
FIG. 6 is a schematic view of the second varied embodiment of the function module with built-in heat dissipation device as disclosed in the first embodiment.

The function module of the present invention as shown in FIG. 4 has single-sided circuit boards with devices on one side. The function module can be manufactured as shown in FIG. 6, becoming a double-sided function module with devices on both sides of the circuit boards. Thus, the function module 100 according to another varied embodiment has a first circuit board 110 with a third surface 112 and a fifth device 151 disposed thereon. The third surface 112 is opposite to the first surface 111. In addition, the function module 100 has a second circuit board 120 with a fourth surface 122 and a sixth device 161 disposed thereon. The fourth surface 122 is opposite to the first surface 121.

To manufacture the function module 100, the first and second devices 114, and 115 are disposed on the first surface 111 of the first circuit board 110. Then, the first height-compensation heat spreader 116 is abutted on the first and second devices 114, and 115. Similarly, the third and fourth devices 124, and 125 are disposed on the second circuit board 120. Then, the second height-compensation heat spreader 126 is abutted on the third and fourth devices 124, 125. Next, the first circuit board 110 is coupled to the second circuit board 120 via the flat cable 145 as shown in FIG. 5a, or via the connector 146 as shown in FIG. 6. Then, the first circuit board 110 faces the second circuit board 120. Finally, the heat dissipation fin 130 is disposed between the first circuit board 110 and the second circuit board 120 to obtain the function module 100 as shown in FIG. 2. Furthermore, a fan 150 is connected to the heat dissipation fin 130 such that heat from the function module can also be dissipated by the heat dissipation fin and the fan.

SECOND EMBODIMENT

The second embodiment also eliminates the heat pipe to reduce thermal resistance thereof, and thus, increase heat dissipation and minimize material and manufacturing costs.

Figure 7:
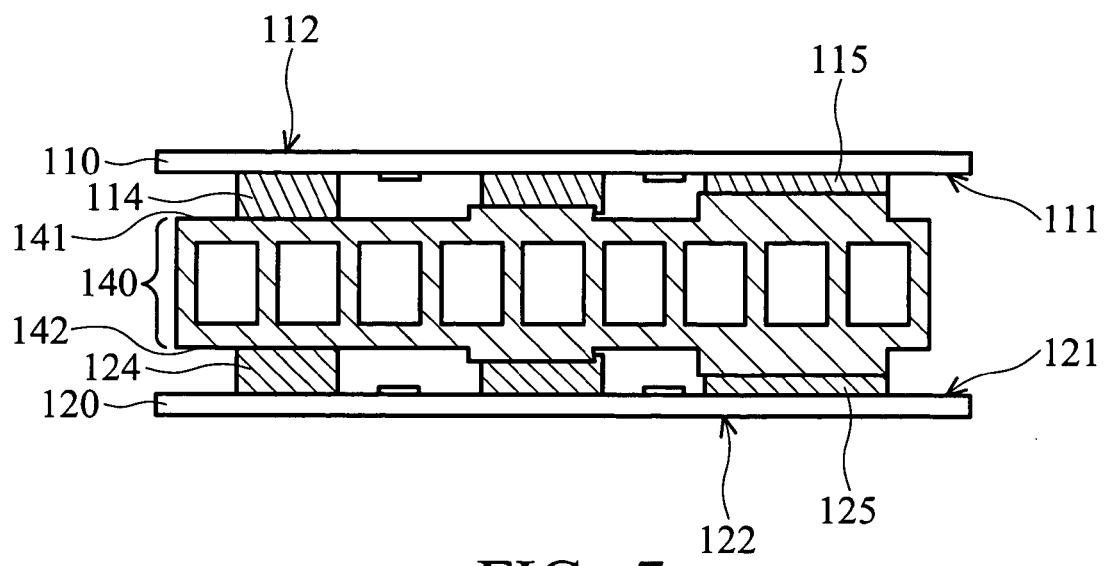
FIG. 7 is a side view of a function module with built-in heat dissipation device according to the second embodiment of the present invention.

FIG. 7 is a side view of a function module 100 with built-in heat dissipation device 140 according to the second embodiment of the present invention. As shown in FIG. 7, the first and second heat spreaders 116, 126 and the heat dissipation fin 130 are integrated into one heat dissipation device 140, further reducing the thermal resistance between the heat spreaders and the heat dissipation fin and minimizing installation costs. The integrated heat dissipation device 140 has first and second heat conduction faces 141, and 142. The first heat conduction face 141 is a stepped face, abutting the first and second devices 114, and 115 simultaneously, and the second heat conduction face 142 is also a stepped face, abutting the third and fourth devices 124, and 125 simultaneously. Thus, the integrated heat dissipation device 140 is abutted against the devices 114, 115, 124, and 125 between the first circuit board 110 and the second circuit board 120 respectively.

Figure 8:
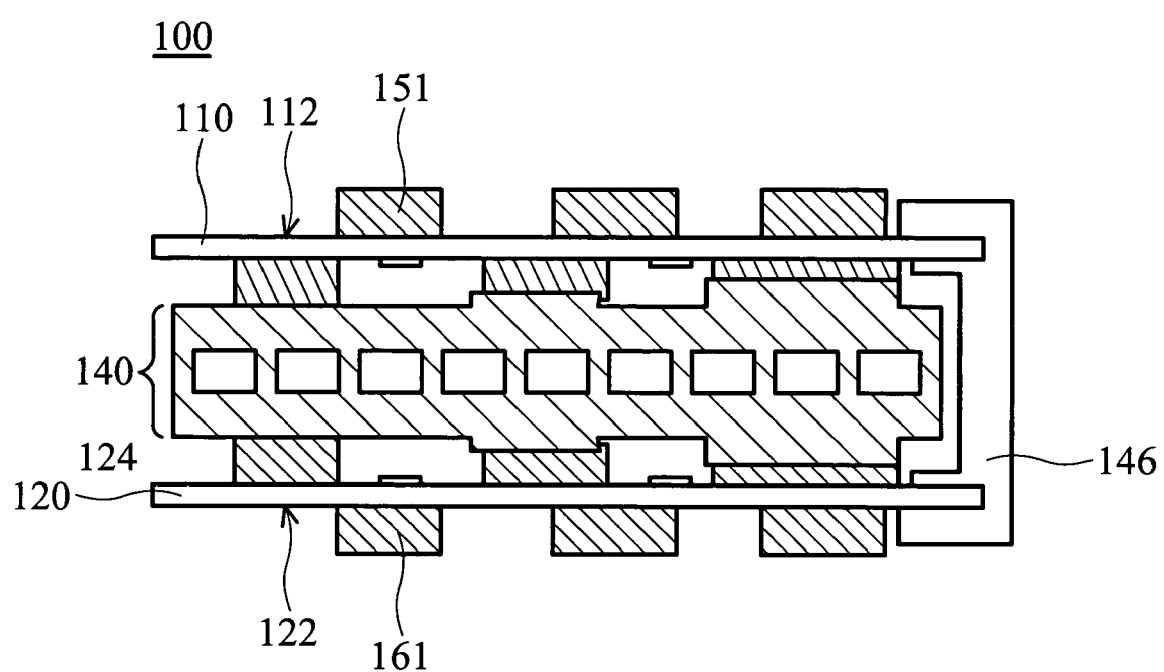
FIG. 8 is a schematic view of a function module with built-in heat dissipation device according to a varied embodiment of the present invention.

Similar to the first embodiment, the function module 100 of the second embodiment as shown in FIG. 7 has single-sided circuit boards with devices on one side. The function module 100 can be manufactured as shown in FIG. 8, to become a double-sided function module with devices on both sides of the circuit boards. Thus, the function module 100 according to a varied embodiment has a first circuit board 110 with a third surface 112 and a fifth device 151 disposed thereon. The third surface 112 is opposite to the first surface 111. In addition, the function module 100 has a second circuit board 120 with a fourth surface 122 and a sixth device 161 disposed thereon. The fourth surface 122 is opposite to the first surface 121.

The function module 100 with built-in heat dissipation device is stated as above.

To manufacture the function module 100, the first and second devices 114, and 115 are disposed on the first surface 111 of the first circuit board 110, and similarly, the third and fourth devices 124, and 125 are disposed on the second circuit board 120. Next, the first circuit board 110 is coupled to the second circuit board 120 via the flat cable 145 as shown in FIG. 3 or a connector 146 of FIG. 8. Then, the first surface 111 of the first circuit board 110 faces the second surface 121 of the second circuit board 120. Finally, the integrated heat dissipation device 140 is disposed between the first circuit board 110 and the second circuit board 120 to obtain the function module 100. Furthermore, as shown in FIG. 2, a fan 150 is connected to the heat dissipation device to dissipate heat from the function module.

As stated above, the principle of the present invention is to modify the function module and to increase heat dissipation efficiency. The function module 100 is modified so that it is divided into two circuit boards with devices on each surface of the two circuit boards. The opposite surface of the contact face is a ground surface or a power supply disposed thereon. By connecting the heat spreaders and the heat dissipation fin or integrating them to become one heat dissipation device with heat conduction faces, a sandwich-style structure is formed in a manner that the circuit boards mounted with different devices is abutted against the heat dissipation fin or device. Thus, heat can be easily and quickly dissipated via the heat dissipation device and conveyed by airflow of the fan to the outside environment.

The ground surface or the power supply further dissipates heat by increasing heat dissipation area thereon. The heat produced from the devices is uniformly conducted to the copper surfaces. The heat is carried away by radiation and convection so that a heat pipe is not necessary, and thus, the modified structure of the present invention eliminates the extra cost of the heat pipes, and further reduces thermal resistance.

Thus, the advantage of the present invention is that the structural complexity is minimized with a minimum number of elements such as the heat spreaders, the heat dissipation fins, and the fans. Two circuit boards sharing one heat dissipation device and a fan reduces the thermal resistance related to heat pipe and maximize the available space in the system. In addition, the heat spreaders and the heat dissipation fins can be integrated into one unit so that extra installation cost is also minimized.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A function module with built-in heat dissipation device, comprising:
   a first circuit board having a first surface, a first device, and a second device, wherein the first and second devices have different heights and are disposed on the first surface;
   a second circuit board having a second surface facing the first surface, a third device and a fourth device, wherein the third and the fourth devices have different heights and are disposed on the second surface;
   a first heat spreader having a first face and a third face, opposite to the first face, wherein the first face is a stepped face and contacts the first and second devices simultaneously, and the third face is a flat face;
   a second heat spreader having a second face and a fourth face, opposite to the second face, wherein the second face is a stepped face and contacts the third and fourth devices simultaneously, and the fourth face is a flat face; and
   a heat dissipation fin, disposed between the first circuit board and the second circuit board, abutting the third face of the first heat spreader and the fourth face of the second heat spreader layer respectively.

2. The function module as claimed in claim 1, wherein the first circuit board further includes a third surface, opposite to the first surface, and the third surface is a ground surface.

3. The function module as claimed in claim 2, wherein the ground surface comprises copper.

4. The function module as claimed in claim 1, wherein the second circuit board further includes a fourth surface, opposite to the second surface, and the fourth surface is a ground surface.

5. The function module as claimed in claim 4, wherein the ground surface comprises copper.

6. The function module as claimed in claim 1, wherein the first circuit board further includes a first power supply and a third surface, opposite to the first surface, and the power supply is disposed on the third surface.

7. The function module as claimed in claim 1, wherein the second circuit board further includes a second power supply and a fourth surface, opposite to the second surface, and the power supply is disposed on the fourth surface.

8. The function module as claimed in claim 1, further comprising a flat cable connecting the first circuit board and the second circuit board, providing communicability therebetween.

9. The function module as claimed in claim 1, further comprising a connector connecting the first circuit board and the second circuit board, providing communicability therebetween.

10. The function module as claimed in claim 9, wherein the connector is a slot connector.

11. The function module as claimed in claim 1, wherein the first and second heat spreaders are made of copper, aluminum, metal, metallic composites or non-metallic composites.

12. The function module as claimed in claim 1, wherein the first and second heat spreaders have a thermal conductivity greater than or equal to 100 W/m·K.

13. The function module as claimed in claim 1, wherein a brazing solder, tin solder, thermal interface material, or grease is disposed between the first heat spreader and the heat dissipation fin.

14. The function module as claimed in claim 1, wherein a brazing solder, tin solder, thermal interface material, or grease is disposed between the second heat spreader and the heat dissipation fin.

15. The function module as claimed in claim 1, further comprising a fan, connected to the heat dissipation fin, for further dissipation of heat therefrom.

16. The function module as claimed in claim 1, wherein the first circuit board further includes a third surface and a fifth device, disposed thereon.

17. The function module as claimed in claim 1, wherein the second circuit board further includes a fourth surface and a sixth device, disposed thereon.

18. A function module comprising:
   a first circuit board having a first surface, a first device, and a second device, wherein the first and second devices have different heights and are disposed on the first surface;
   a second circuit board having a second surface facing the first surface, a third device and a fourth device, wherein the third and the fourth devices have different heights and are disposed on the second surface; and
   a heat dissipation device having a first heat conduction face and a second heat conduction face, disposed between the first circuit board and the second circuit board, wherein the first heat conduction face is a stepped face, abutting the first and second devices simultaneously, and the second heat conduction face is a stepped face, abutting the third and fourth devices simultaneously, wherein the heat dissipation device has a fin structure set between the first heat conduction face and the second heat conduction face.

19. The function module as claimed in claim 18, wherein the heat dissipation device is made of copper, aluminum, metal, metallic composites or non-metallic composites.

20. The function module as claimed in claim 18, wherein the heat dissipation device has a thermal conductivity greater than or equal to 100 W/m·K.

21. A function module comprising:
a first circuit board having a first surface, a first device, and a second device, wherein the first and second devices have different heights and are disposed on the first surface;
a second circuit board having a second surface facing the first surface, a third device and a fourth device, wherein the third and the fourth devices have different heights and are disposed on the second surface;
a heat dissipation device having a first heat conduction face and a second heat conduction face, disposed between the first circuit board and the second circuit board, wherein the first heat conduction face is a stepped face, abutting the first and second devices simultaneously, and the second heat conduction face is a stepped face, abutting the third and fourth devices simultaneously; and
a flat cable connecting the first circuit board and the second circuit board, providing communicability therebetween.

22. The function module as claimed in claim 18, further comprising a connector connecting the first circuit board and the second circuit board, providing communicability therebetween.

23. The function module as claimed in claim 22, wherein the connector is a slot connector.

24. A function module comprising:
a first circuit board having a first surface, a first device, and a second device, wherein the first and second devices have different heights and are disposed on the first surface;
a second circuit board having a second surface facing the first surface, a third device and a fourth device, wherein the third and the fourth devices have different heights and are disposed on the second surface;
a heat dissipation device having a first heat conduction face and a second heat conduction face, disposed between the first circuit board and the second circuit board, wherein the first heat conduction face is a stepped face, abutting the first and second devices simultaneously, and the second heat conduction face is a stepped face, abutting the third and fourth devices simultaneously; and
a fan, connected to the heat dissipation device, for dissipating heat therefrom.

25. The function module as claimed in claim 18, wherein the first circuit board further has a third surface, opposite to the first surface, and the third surface is a ground surface.

26. The function module as claimed in claim 25, wherein the ground surface comprises copper.

27. The function module as claimed in claim 18, wherein the second circuit board further includes a fourth surface, opposite to the second surface, and the fourth surface is a ground surface.

28. The function module as claimed in claim 27, wherein the ground surface comprises copper.

29. The function module as claimed in claim 18, wherein the first circuit board further includes a first power supply and a third surface, opposite to the first surface, and the power supply is disposed on the third surface.

30. The function module as claimed in claim 18, wherein the second circuit board further includes a second power supply and a fourth surface, opposite to the second surface, and the power supply is disposed on the fourth surface.

* * * * *